United States Patent [19]
Nakase et al.

[11] Patent Number: 5,548,112
[45] Date of Patent: Aug. 20, 1996

[54] PHOTODETECTING CIRCUIT USING AVALANCHE PHOTODIODE

[75] Inventors: Shigeki Nakase; Shigeyuki Nakamura; Tsuyoshi Ohta, all of Hamamatsu, Japan

[73] Assignee: Hamamatsu Photonics K.K., Hamamatsu, Japan

[21] Appl. No.: 359,722

[22] Filed: Dec. 20, 1994

[30] Foreign Application Priority Data

Dec. 20, 1993 [JP] Japan ..................... 5-319816

[51] Int. Cl.⁶ .................................................. H01J 40/14
[52] U.S. Cl. .................. 250/214 C; 250/214 R; 327/514
[58] Field of Search ................ 250/214.1, 214 R, 250/214 C; 327/513, 514

[56] References Cited

U.S. PATENT DOCUMENTS

| | | | |
|---|---|---|---|
| 3,560,755 | 2/1971 | Blaise . | |
| 4,153,835 | 5/1979 | Lau et al. . | |
| 4,236,069 | 11/1980 | Laughoin | 250/214 AG |
| 4,292,514 | 9/1981 | Ohtomo | 250/214 C |
| 4,438,348 | 3/1984 | Casper et al. . | |
| 4,626,676 | 12/1986 | Gerardin | 250/214 R |
| 4,730,128 | 3/1988 | Seki . | |

FOREIGN PATENT DOCUMENTS

| | | |
|---|---|---|
| 55-68683 | 5/1980 | Japan . |
| 60-111540 | 6/1985 | Japan . |
| 61-181336 | 11/1986 | Japan . |

*Primary Examiner*—Edward P. Westin
*Assistant Examiner*—Stephen Calogero
*Attorney, Agent, or Firm*—Cushman Darby & Cushman, L.L.P.

[57] ABSTRACT

A photodetecting circuit using an avalanche photodiode of the present invention has an avalanche photodiode, and a bias control means for applying a bias voltage to the avalanche photodiode to drive the avalanche photodiode at a high multiplication factor. The bias control means has a diode having the same temperature dependence of a breakdown voltage as that of the avalanche photodiode, and a control circuit for applying positive and negative potentials with respect to the ground potential between the anode and the cathode of the diode such that the diode is set in a breakdown state at a predetermined current. A positive or negative potential is applied from one of the anode and the cathode of the avalanche photodiode as a bias voltage, and a photocurrent is output from the other terminal of the avalanche photodiode.

18 Claims, 6 Drawing Sheets

Fig. 1

(PRIOR ART)

PHOTODETECTING CIRCUIT USING AVALANCHE PHOTODIODE

BACKGROUND OF THE INVENTION

1. Field of the Invention

The present invention relates to a photodetecting circuit using an avalanche photodiode.

2. Related Background Art

An avalanche photodiode (APD) is a semiconductor photodetector which utilizes avalanche multiplication to achieve high sensitivity and response speed. Avalanche photodiodes are used as detectors for optical communications and low light level detections. Since such a device is comprised of semiconductor materials, the gain of an avalanche photodiode has a temperature dependence. In order to maintain a constant gain as a function of temperature it is necessary to adjust the bias voltage of the avalanche photodiode in a controlled manner. Various schemes have been proposed to effectively control the bias voltage of the APD.

Figure 1:
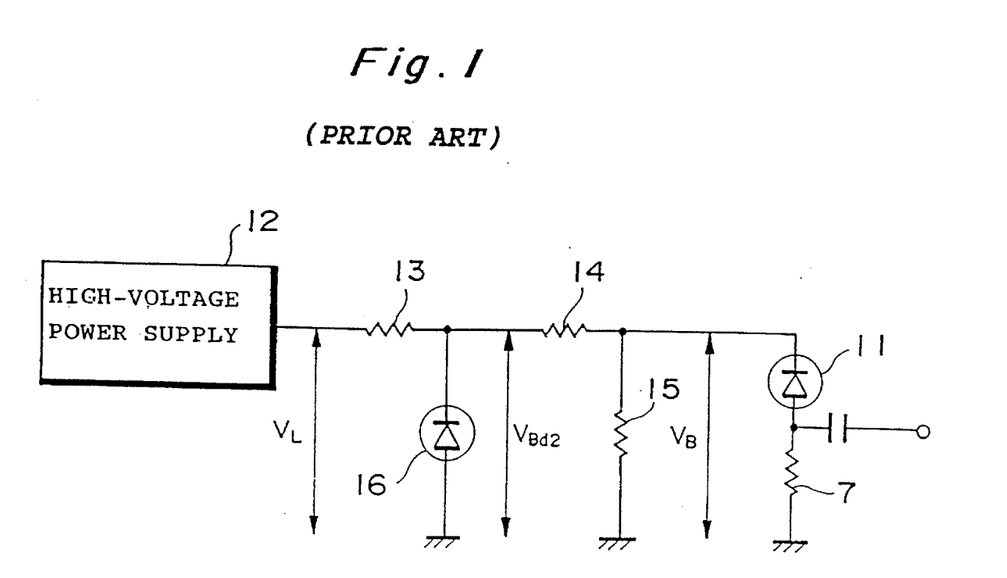
FIG. 1 is a block diagram showing the arrangement of a bias control scheme according to the prior art.

One of those schemes is described in, e.g., Japanese Utility Model Laid-Open No. 61-181336 (FIG. 1). In this circuit, two APDs 16 and 11, having almost the same characteristics, are used. The APD 16 is shielded from light and is caused to break down by a current source (a high-voltage power supply 12 and a resistor 13). A breakdown voltage generated between a cathode and an anode of the APD 16 is divided by resistors 14 and 15 and applied to the other signal detection APD 11 as a bias voltage (reference numeral 7 denotes a load resistor). The breakdown voltage of the shielded APD changes depending on temperature. For this reason, this APD is used as a temperature sensor, thereby compensating for variations in the bias voltage of the signal detection APD. To obtain a predetermined multiplication factor, the breakdown voltage can be divided by a corresponding voltage division ratio to obtain a bias voltage, resulting in a simple arrangement.

Another scheme is described in Japanese Patent Laid-Open No. 55-068683. In this circuit, a breakdown voltage is measured during a set period of time. Within this period of time, the breakdown is detected by monitoring the current of flowthrough an APD. During a normal photometry, a bias voltage is set to be lower than the breakdown voltage, thereby maintaining a predetermined multiplication factor.

SUMMARY OF THE INVENTION

It is an object of the present invention to provide a circuit using an avalanche photodiode, which is effectively used to perform measurement of light intensity within a frequency range from DC components to high-frequency components at high accuracy.

According to the present invention, there is provided a photodetecting circuit using an avalanche photodiode, comprising an avalanche photodiode, and bias control means for applying a bias voltage to the avalanche photodiode, the bias control means having (a) a diode having substantially the same temperature dependence of a breakdown voltage as that of the photodetecting avalanche photodiode, and (b) a control circuit for adjusting the bias voltage of the avalanche photodiode according to a current output from the diode which is feedback-controlled in a breakdown state.

The reference potential can be the ground potential.

The diode is preferably an avalanche photodiode having substantially the same structure as that of the avalanche photodiode.

In a photodetecting circuit using an avalanche photodiode of the present invention, a diode is set in a breakdown state at a predetermined current. This diode has a temperature dependence of a breakdown voltage, similar to that of the avalanche photodiode. A positive or a negative voltage is applied from the anode or the cathode of the avalanche photodiode as a bias voltage. A potential at another terminal, i.e., a terminal from which the photocurrent of the avalanche photodiode is extracted, is set at almost the ground potential. For this reason, the difference between the potential at the other terminal of the avalanche photodiode and the ground potential is much smaller than the bias voltage. No capacitor is needed for blocking a high voltage. Therefore, the DC components of the photocurrent can also be extracted.

Since the positive and negative voltages are applied to the diode to keep the current of the diode in the breakdown state at a predetermined value, the bias voltage of the avalanche photodiode is set such that the avalanche photodiode stably operates regardless of changes in temperature.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 2:
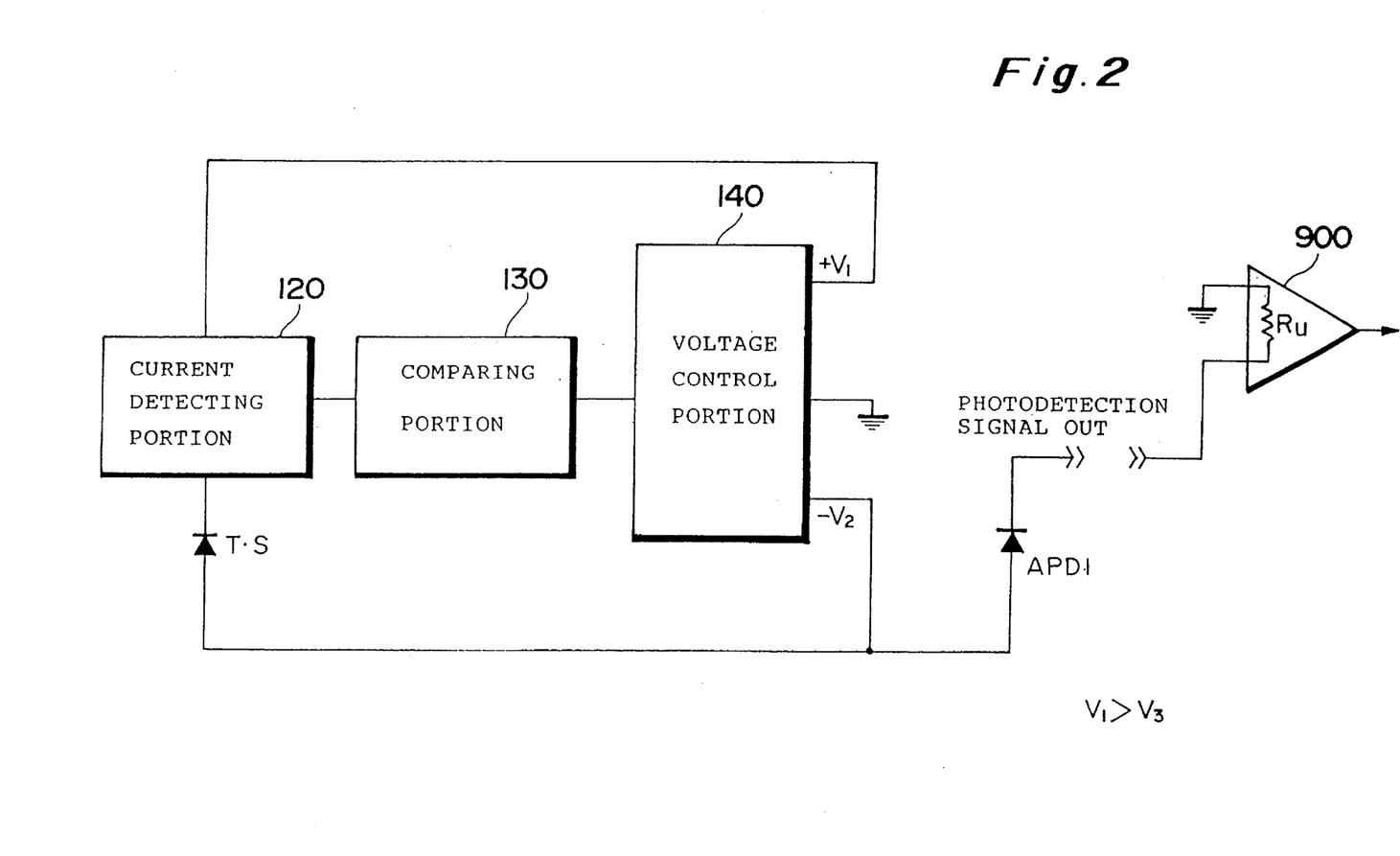
FIG. 2 is a block diagram schematically showing the arrangement of the present invention.

An embodiment of the present invention will be described with reference to the accompanying drawings. FIG. 2 is a block diagram schematically showing the arrangement of a photodetecting circuit using the avalanche photodiode of the present invention. This photodetecting circuit has an avalanche photodiode APD1 and a means for applying a bias voltage to the avalanche photodiode APD1, i.e., a diode T·S, a current detecting portion 120, a comparing portion 130, and a voltage control portion 140.

The avalanche photodiode APD1 outputs a photocurrent having a magnitude corresponding to the illuminated light power as a photodetection signal output OUT. The cathode (i.e., the output terminal of the photodetection signal) of the avalanche photodiode APD1 is set at the ground potential through a load resistor $R_u$ of a current detector 900. The anode of the avalanche photodiode APD1 is set at a potential $-V_2$ by the voltage control portion 140. A voltage drop between the load resistor as viewed from the optical signal output OUT is much smaller than a value $V_2$. For this reason, the voltage value across the two ends of the avalanche photodiode APD1 is almost equal to the value $V_2$ even when a photocurrent is presented. Assume that the input portion of the current detector 900 is constituted by a current-voltage conversion circuit having an operational amplifier structure and connected to the optical signal output OUT. In this case, the cathode of the avalanche photodiode APD1 is set at almost the same potential as the ground potential, and the voltage applied between the two ends of the avalanche photodiode APD1 is almost equal to the value $V_2$.

The cathode of the diode T·S is set at a potential $V_1$ by the voltage control portion 140, and the anode of the diode T·S is set at the potential $-V_2$ by the voltage control portion 140, thereby setting the diode T·S in a breakdown state. A current in the breakdown state changes depending on temperature, so the diode T·S serves as a temperature sensor. To perform temperature compensation of the multiplication factor of the avalanche photodiode APD1 in accordance with a change in characteristics of the diode T·S caused due to a temperature change, the diode T·S preferably has almost the same temperature dependence as that of the avalanche photodiode APD1. For this reason, an avalanche photodiode having almost the same temperature dependence as that of the avalanche photodiode APD1 is shielded from light and used as the diode T·S.

The current detecting portion 120 detects the current of the diode T·S in the breakdown state. The comparing portion 130 compares the detected current with a predetermined value and outputs a voltage or a current according to the comparison result. The voltage control portion 140 controls the potentials $V_1$ and $-V_2$ in accordance with the comparison result. In this manner, a feedback loop is formed, and the potentials $V_1$ and $-V_2$ are controlled to keep the current of the diode T·S in the breakdown state at a predetermined value. As a control method, either the ratio of the voltage $(V_1+V_2)$ between the two ends of the diode T·S to the voltage $(V_2)$ between the two ends of the avalanche photodiode APD1 is kept at a predetermined value, or a method for keeping the difference therebetween is kept at a predetermined value, i.e., the potential $V_1$ is fixed.

Figure 3:
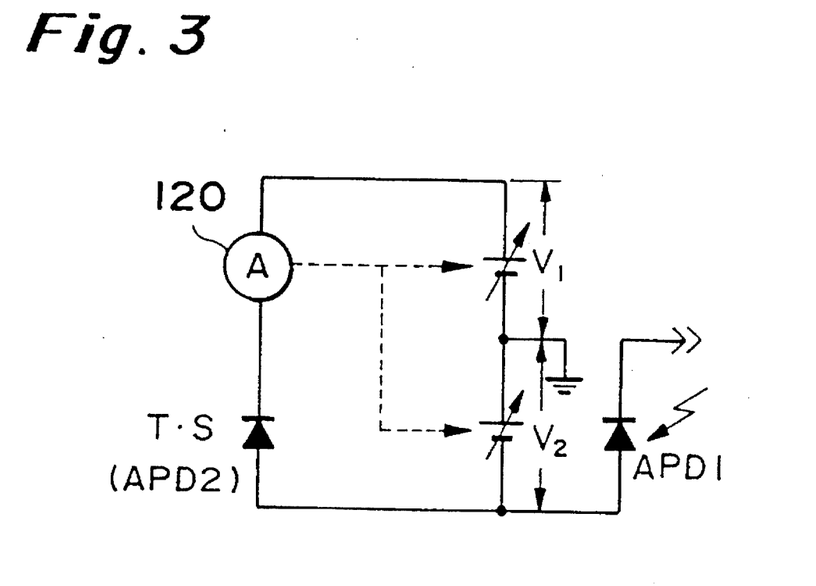
FIGS. 3 and 4 are block diagrams schematically showing control of a positive voltage $V_1$ and a negative voltage $V_2$.
Figure 4:
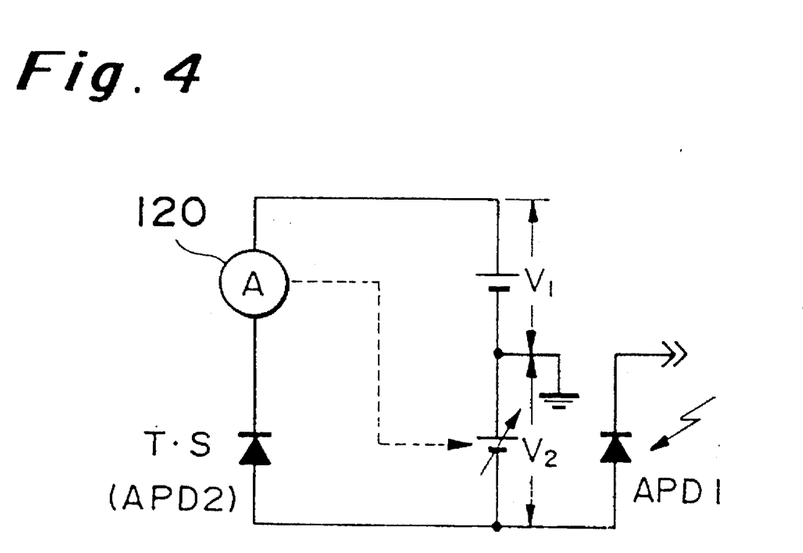

FIGS. 3 and 4 are block diagrams schematically showing these methods. FIG. 3 is a block diagram showing an arrangement for keeping the ratio at a predetermined value. When the current of the diode T·S increases, the voltages $V_1$ and $V_2$ are decreased to keep the ratio "$(V_1+V_2):V_2$" at a predetermined value. When the current of the diode T·S decreases, the voltages $V_1$ and $V_2$ are increased to keep this ratio at the predetermined value. In this manner, the voltage $(V_1+V_2)$ between the two ends of the diode T·S is changed to keep the current of the diode T·S at a predetermined value. FIG. 4 is a block diagram showing an arrangement for keeping the difference at a predetermined value. In this case, since the difference corresponds to the voltage $V_1$, the voltage $V_1$ serves as a constant voltage source. When the current of the diode T·S increases, the voltage $V_2$ is decreased. When the current of the diode T·S decreases, the voltage $V_2$ is increased. In this manner, the voltage $(V_1+V_2)$ between the two ends of the diode T·S is changed while the voltage $V_1$ corresponding to the difference is kept at a predetermined value, thereby keeping the current of the diode T·S at a predetermined value.

In both cases, regardless of changes in temperature, the voltage $(V_1+V_2)$ is changed to keep the current of the diode T·S at a predetermined value, and the voltage $V_2$ changes accordingly. Since the diode T·S has almost the same temperature dependence as that of the avalanche photodiode APD1, the voltage $V_2$ changes to compensate for the temperature dependence of the avalanche photodiode APD1. For this reason, variations in photocurrent from the avalanche photodiode APD1, which are caused due to a change in temperature, are suppressed, so an optical signal output OUT having a magnitude corresponding to the illuminated light power can be obtained.

Since the cathode of the avalanche photodiode APD1 is set at almost the same potential as the ground potential at which the current detector 900 is formed, no capacitor for blocking a high voltage is needed. Therefore, a photocurrent from the avalanche photodiode APD1 can be extracted without losing DC components.

Figure 5:
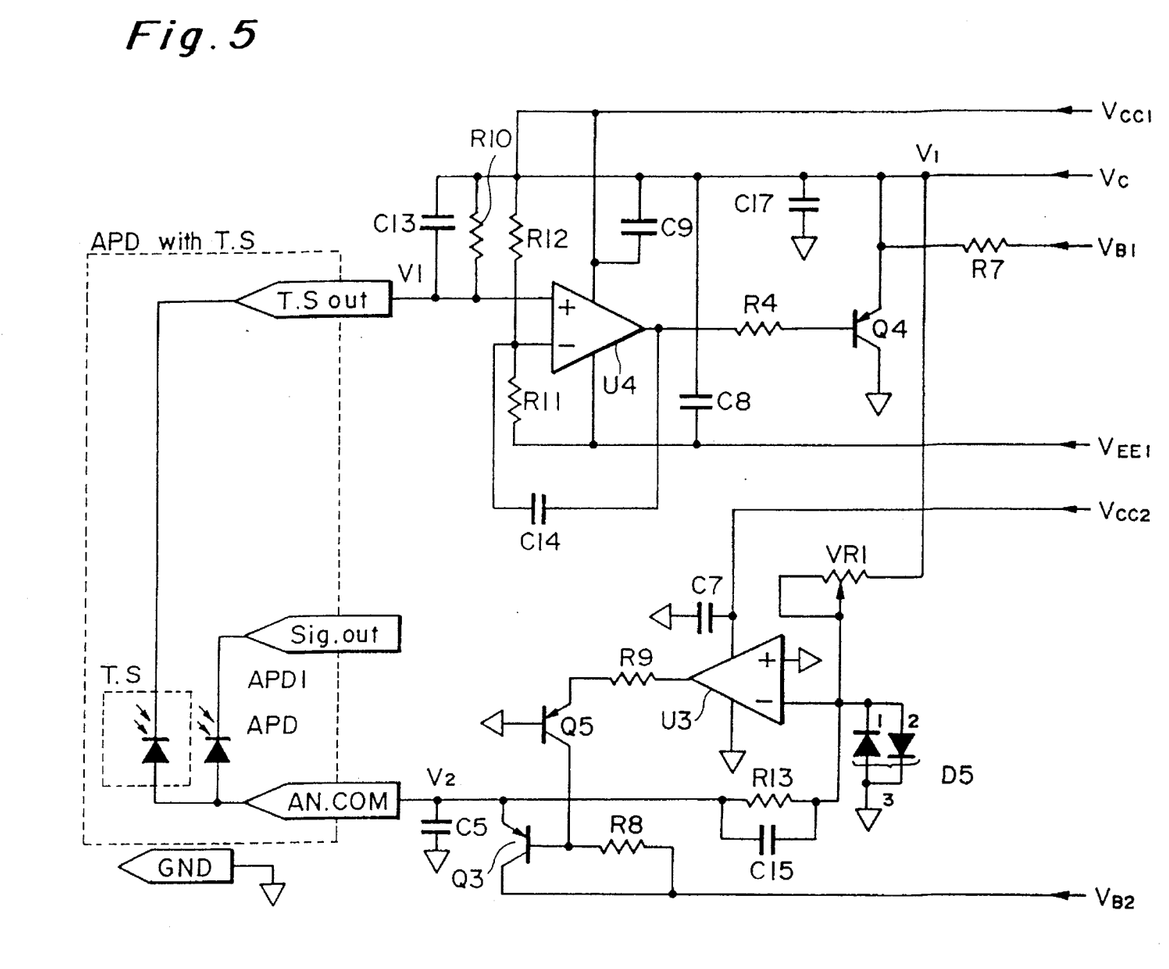
FIG. 5 is a block diagram showing an actual circuit arrangement for keeping the voltage ratio at a predetermined value.
Figure 6:
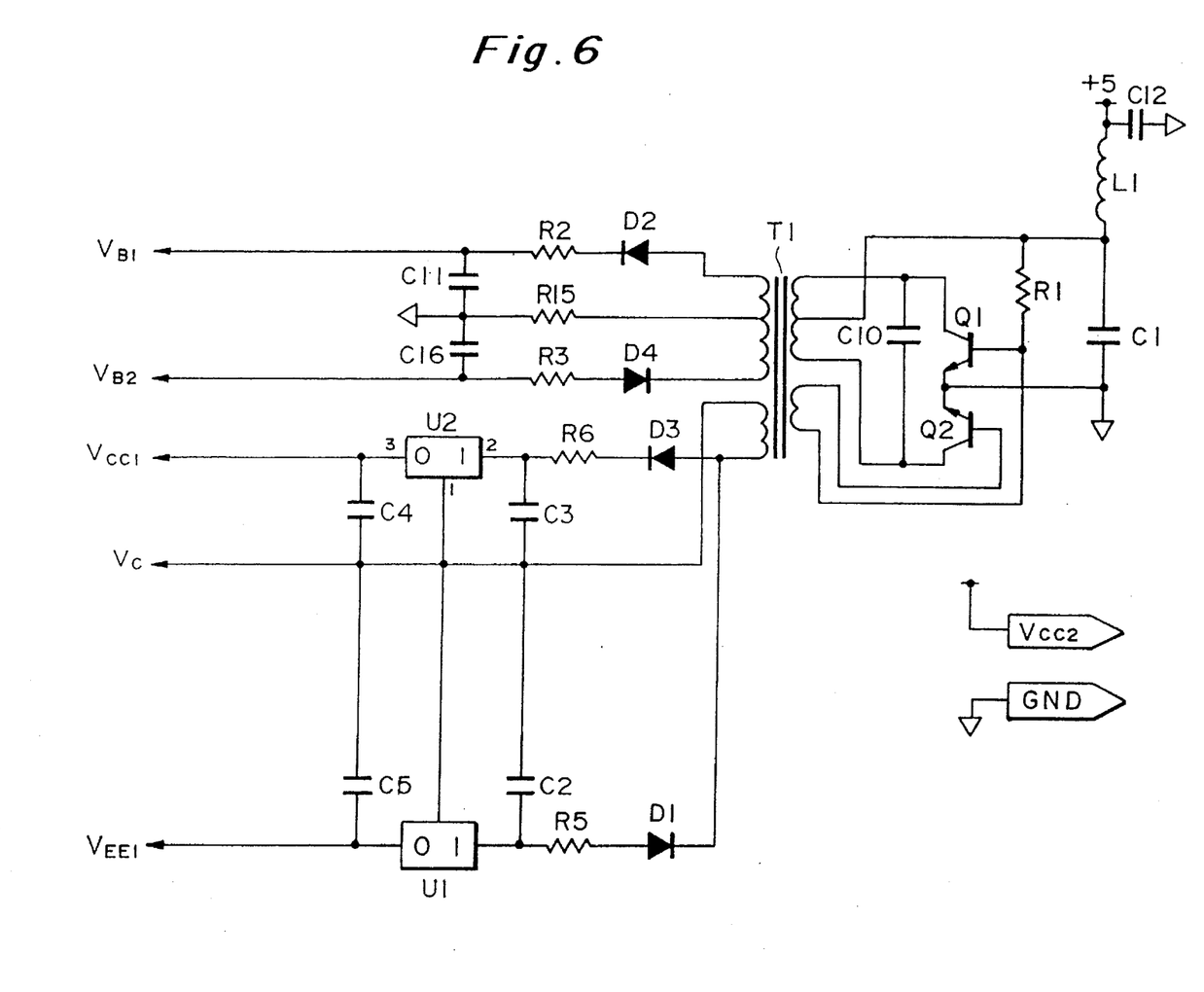
FIG. 6 is a block diagram showing the arrangement of a power supply circuit.

FIG. 5 is a block diagram showing an actual circuit arrangement for keeping the ratio at a predetermined value. FIG. 6 is a block diagram showing a power supply circuit.

The avalanche photodiode APD1 and the diode T·S are formed on the same chip to have a common anode, so they are at almost the same temperature. The anode of the avalanche photodiode APD1 is set at the potential $-V_2$. A photocurrent is extracted from the cathode. The diode T·S has the same structure to have almost the same temperature dependence as that of the avalanche photodiode APD1 although it is shielded from light incident on the avalanche photodiode APD1. The cathode of the diode T·S is set at the potential $V_1$, and the voltage between its two ends is $(V_1+V_2)$ A current flowing through the diode T·S is detected by a voltage drop across a resistor R10 (this voltage drop is much smaller than the positive voltage $V_1$ and can be ignored). An amplifier U4 compares a positive input with a negative input and amplifies the difference therebetween. The difference between the voltage drop across the resistor R10 and the voltage of a resistor R12 is amplified and output. The voltage of the resistor R12 is obtained upon dividing positive and negative power supply voltages $V_{CC1}$ and $V_{EE1}$ to the amplifier U4 by the resistors R12 and R11. The current flowing through the diode T·S is compared with a value determined by this voltage.

A transistor Q4 and a resistor R7 constitute a so-called shunt regulator. An output from the amplifier U4 is supplied to the base of the transistor Q4 through a resistor R4. The collector-emitter current of the transistor Q4 changes in accordance with the output from the amplifier U4. By the voltage drop across the resistor R7, a positive high voltage VB1 from the power supply circuit in FIG. 6 is dropped by control using the output from the amplifier U4, and the potential $V_1$ is biased to the cathode of the diode T·S. The positive and negative power supply voltages $V_{CC1}$ and $V_{EE1}$ to the amplifier U4 are biased from the power supply circuit in FIG. 6 to keep predetermined positive and negative potentials from an intermediate potential $V_C$. When the potential $V_1$ changes, the potentials of the power supply voltages $V_{CC1}$ and $V_{EE1}$ with reference to ground GND change. However, the differences $(V_{CC1}-V_1)$ and $(V_{EE1}-V_1)$ are kept at predetermined values.

When the current flowing through the diode T·S increases, the voltage between the two ends of the resistor R10 increases, and the potential from the potential $V_1$ (intermediate potential $V_C$) drops, so the output of the amplifier U4 decreases. For this reason, the base current of the transistor Q4 increases, and the potential $V_1$ decreases because of an increase in the voltage drop across resistor R7. To the contrary, when the current flowing through the diode T·S decreases, the potential $V_1$ is controlled to decrease. In this manner, a feedback loop is formed to keep the current of the diode T·S in the breakdown state at a predetermined value.

The potential $-V_2$ of the anode of the avalanche photodiode APD1 is controlled by a regulator constituted by an amplifier U3, a transistor Q3, and peripheral elements thereof. The amplifier U3 detects whether the ratio "$(V_1+V_2):V_2$" is kept at a predetermined value. The positive input terminal of the amplifier U3 is connected to ground, and its negative input terminal is connected to resistors R13 and VR1 for dividing the potentials $V_1$ and $-V_2$. The ratio "$(V_1+V_2):V_2$" is determined by the divider resistors R13 and VR1 and can be adjusted by the volume VR1 (a diode D5 protects the negative input to the amplifier U3).

An output of the amplifier U3 changes the current flowing through a resistor R8 through a resistor R9 and a transistor Q5 to thereby change the base potential of a transistor Q3. A power supply of +5 V ($V_{CC2}$) is used for the amplifier U3. The transistor Q5 protects an output of the amplifier U3 from a negative high voltage. By connecting the base of the transistor Q5 to ground, the emitter potential is set at almost the same voltage as that of ground. A negative high voltage VB2 is applied to the collector of the transistor Q3 from the power supply circuit in FIG. 6, thereby forming an emitter follower circuit. Therefore, a potential almost the same as the base potential of the transistor Q3 is biased to the anode of the avalanche photodiode APD1 as the negative potential $-V_2$.

When the ratio "$(V_1+V_2):V_2$" changes, that is, e.g., the potential $-V_2$ decreases to drop the anode potential of the avalanche photodiode APD1, the potential at the negative input terminal of the amplifier U3 connected to the resistors R13 and VR1 decreases. The output potential of the amplifier U3 rises to increase a current flowing through the resistor R9 and the transistor Q5, thereby increasing the voltage drop between the two ends of a resistor R8. For this reason, the anode potential of the avalanche photodiode APD1 rises to increase the potential $-V_2$. To the contrary, when the potential $V_2$ rises to increase the anode potential of the avalanche photodiode APD1, the anode potential of the avalanche photodiode APD1 drops, thereby decreasing the potential $-V_2$. In this manner, a feedback loop is formed to keep the ratio "$(V_1+V_2):V_2$" at a predetermined value determined by the resistors R13 and VR1.

As described above, in the circuit shown in FIG. 5, the feedback loop is formed to operate such that the current of the diode T·S in the breakdown state and the ratio "$(V_1+V_2):V_2$" are kept at predetermined values.

In the power supply circuit shown in FIG. 6, a switching regulator is constituted using transistors Q1 and Q2. The positive and negative high voltages VB1 and VB2 and the positive and negative power supply voltages $V_{CC1}$ and $V_{EE1}$ applied to the amplifier U4 are generated from the power supply of 5 V by a transformer T1. Diodes D2 and D4 rectify a high-voltage output from the center tap coil of the transformer T1 and output the positive and negative high voltages VB1 and VB2 which are almost equal to each other. Diodes D1 and D3 rectify a switching output from the transformer T1. These rectified outputs are output as the predetermined positive and negative voltages $V_{CC1}$ and $V_{EE1}$ from the center potential $V_C$ by a regulator IC.

Figure 7:
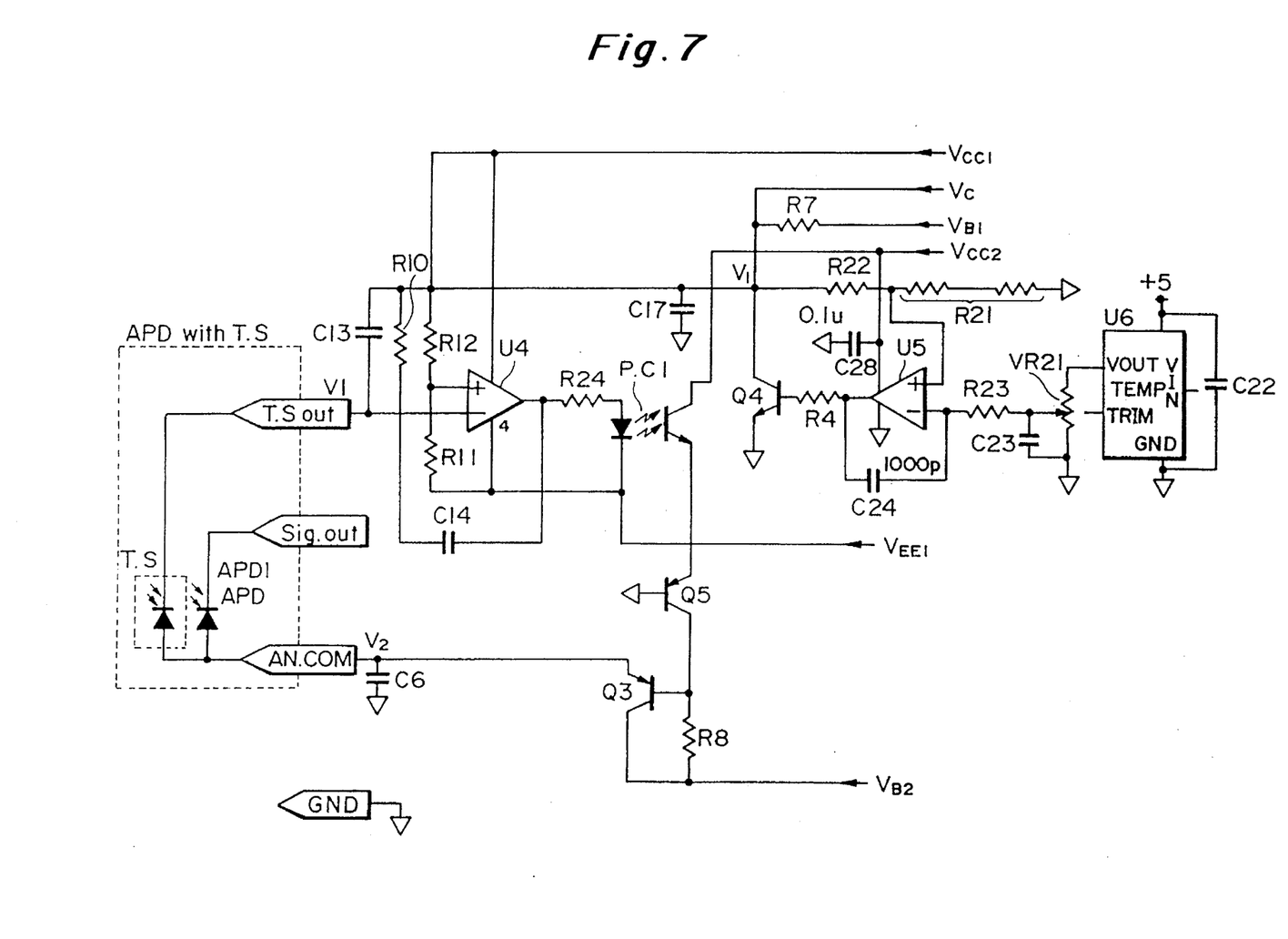
FIG. 7 is a block diagram showing an actual arrangement for keeping the voltage difference at a predetermined value.

FIG. 7 is a block diagram showing an actual circuit arrangement for keeping the difference at a predetermined value. The same power supply circuit as in FIG. 6 is used (in this case, the resistor R15 in FIG. 6 is 100 kΩ).

As in FIG. 5, the avalanche photodiode APD1 and the diode T·S are formed on the same chip. The anode of the avalanche photodiode APD1 is set at the potential $-V_2$. The photocurrent is extracted from the cathode. The cathode of the diode T·S is set at the potential $V_1$. The resistor R10, the amplifier U4, and the peripheral circuits thereof are the same as in FIG. 5. The current flowing through the diode T·S is detected by a voltage drop across the resistor R10, compared with a value determined by the resistors R11 and R12, and output.

An output from the amplifier U4 is supplied to the input side of a photocoupler P.C1 through the resistor R24. The current flowing through the output transistor of the photocoupler P.C1 changes in accordance with the output from the amplifier U4. In accordance with a change in current, the voltage drop across the resistor R8 changes, and the potential $-V_2$ changes accordingly. As in FIG. 5, the transistor Q5 protects the output transistor of the photocoupler P.C1 from a high voltage.

The potential $V_1$ is held at a predetermined value by a shunt regulator constituted by the transistor Q4, an amplifier U5, and a reference voltage IC indicated by reference symbol U6. The reference voltage IC indicated by symbol U6 outputs a predetermined reference voltage from a terminal $V_{OUT}$. The reference voltage is divided by a variable resistor VR21 and applied to the negative input terminal of the amplifier U5. A collector output of the transistor Q4 connected to the output terminal of the amplifier U5 is divided by resistors R22 and R21. The divided output is supplied to the positive input terminal of the amplifier U5. The transistor Q4 and the amplifier U5 form a feedback loop using the divided value of the reference voltage as a reference value. [The divided voltage value]×R22/(R21+R22) is the potential $V_1$. In this manner, the potential $V_1$ is controlled to be a predetermined value determined by voltage division ratio of the variable resistor VR21.

As described above, according to the present invention, a stable bias voltage is obtained regardless of the signal amount, and the avalanche photodiode APD1 can be stably operated. In the conventional circuit shown in FIG. 1, the anode of the avalanche photodiode APD1 is grounded, and a signal is extracted from the cathode applied with a high voltage. For this reason, a capacitor is required to block the high voltage, and the DC component cannot be detected. However, according to the present invention, one of the terminals of the avalanche photodiode APD1 and one of the terminals of the diode T·S can be set at a common potential, so they can be formed on the same substrate. The potentials $V_1$ and $-V_2$ are output from the voltage control portion, and one of these potentials is used as the bias voltage of the avalanche photodiode APD1. Therefore, the optical signal output can be substantially equalized with the ground level, so photometry by DC coupling can be performed with high sensitivity.

In the prior art using time division, photometry cannot be continued for a long time. However, according to the present invention, photometry can be continuously performed.

The present invention is not limited to the above embodiment, and various changes and modifications can be made.

The anodes of the avalanche photodiode APD1 and the diode T·S are connected with each other. However, the cathodes may be commonly connected with each other. In correspondence with this change, the potential $V_1$ may be used as the bias voltage of the avalanche photodiode APD1.

As has been described above, according to the present invention, the control circuit outputs the positive and negative potentials with respect to the reference voltage to the diode such that the current of the diode in the breakdown state is kept at a predetermined value. For this reason, the bias voltage of the avalanche photodiode is stable regardless of a change in temperature, and the photocurrent of the avalanche photodiode, including the DC components, can be extracted from the other terminal of the avalanche photodiode between the potential at the terminal and the ground potential.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 5-319816 filed on Dec. 20, 1993 is hereby incorporated by reference.

What is claimed is:

1. A photodetecting circuit, comprising:

a first avalanche photodiode for receiving an incident light and for outputting a corresponding photocurrent; and bias control means for applying a bias voltage to said avalanche photodiode, said bias control means including:

a diode shielded from the incident light and thermally coupled to said first avalanche photodiode, said diode having a temperature dependence of a breakdown voltage substantially equal to that of said first avalanche photodiode; and a control circuit for setting a first potential higher than a reference potential by a first voltage value at a cathode terminal of said diode and setting a second potential lower than the reference potential by a second voltage value at an anode terminal of said diode to generate a breakdown state in said diode, and for setting the first potential at a cathode of said first avalanche photodiode, setting a third potential higher than the second potential at an anode terminal of said first avalanche photodiode, detecting a current output from said diode and controlling the first and second voltage values corresponding to the current output from said diode, said control circuit maintaining the current output from said diode at a predetermined value.

2. A circuit according to claim 1, wherein said reference potential is ground potential.

3. A circuit according to claim 1, wherein said diode is a second avalanche photodiode having a structure substantially equal to that of said first avalanche photodiode.

4. A circuit according to claim 1, wherein the cathode terminal of said first avalanche photodiode is connected to the cathode terminal of said diode.

5. A circuit according to claim 1, wherein the anode of said first avalanche photodiode is connected to a resistive load.

6. A circuit according to claim 1, wherein said first avalanche photodiode and said diode are integrally formed so as to have a common cathode.

7. A circuit according to claim 1, wherein said control circuit sets a potential substantially equal to the reference potential as the third potential at the anode terminal of said first avalanche photodiode.

8. A circuit according to claim 1, wherein said control circuit changes the first and second voltage values while maintaining a ratio of the first voltage value to the second voltage value at a predetermined ratio.

9. A circuit according to claim 1, wherein said control circuit changes the first voltage value while maintaining the second voltage value at a predetermined voltage value.

10. A photodetecting circuit, comprising:

a first avalanche photodiode for receiving an incident light and for outputting a corresponding photocurrent; and bias control means for applying a bias voltage to said first avalanche photodiode, said bias control means including:

a diode isolated from the incident light and thermally coupled to said first avalanche photodiode, said diode having a temperature dependence of a breakdown voltage substantially equal to that of said first avalanche photodiode; and a control circuit for setting a first potential higher than a reference potential by a first voltage value at a cathode terminal of said diode and setting a second potential lower than the reference potential by a second voltage value at an anode terminal of said diode to generate a breakdown state in said diode, and for setting the second potential at an anode of said first avalanche photodiode, setting a third potential lower than the first potential at a cathode terminal of said first avalanche photodiode, detecting a current output from said diode and controlling the first and second voltage values corresponding to the current output, said control circuit maintaining the current output from said diode at a predetermined value.

11. A circuit according to claim 10, wherein said reference potential is ground potential.

12. A circuit according to claim 10, wherein said diode is a second avalanche photodiode having a structure substantially equal to that of said first avalanche photodiode.

13. A circuit according to claim 10, wherein the anode terminal of said first avalanche photodiode is connected to the anode of said diode.

14. A circuit according to claim 10, wherein the cathode of said first avalanche photodiode is connected to a resistive load.

15. A circuit according to claim 10, wherein said first avalanche photodiode and said diode are integrally formed so as to have a common anode.

16. A circuit according to claim 10, wherein said control circuit sets a potential substantially equal to the reference potential as the third potential at the cathode terminal of said first avalanche photodiode.

17. A circuit according to claim 10, wherein said control circuit changes the first and second voltage values while maintaining a ratio of the first voltage value to the second voltage value at a predetermined ratio.

18. A circuit according to claim 10, wherein said control circuit changes the second voltage value while maintaining the first voltage value at a predetermined voltage value.

* * * * *